United States Patent [19]

Wada

[11] Patent Number: 4,947,392
[45] Date of Patent: Aug. 7, 1990

[54] MALFUNCTION DIAGNOSTIC APPARATUS FOR VEHICLE CONTROL SYSTEM

[75] Inventor: Shunichi Wada, Hyogo, Japan

[73] Assignee: Mitsubhishi Denki Kabushiki Kaisha, Tokyo, Japan

[21] Appl. No.: 247,544

[22] Filed: Sep. 22, 1988

[30] Foreign Application Priority Data

Sep. 22, 1987 [JP] Japan .................. 62-238113

[51] Int. Cl.$^5$ ............................................. G06E 11/28
[52] U.S. Cl. .................................. 371/16.3; 364/431.1
[58] Field of Search ...................... 371/15.1, 16.3, 16.4, 371/68.3; 364/431.1, 431.2, 431.3, 431.4

[56] References Cited

U.S. PATENT DOCUMENTS

| 4,031,363 | 6/1977 | Freeman et al. | |
|---|---|---|---|
| 4,118,792 | 10/1978 | Strugger | 371/16.3 |
| 4,245,315 | 1/1981 | Barman | 371/16.3 |
| 4,277,772 | 7/1981 | Kastura et al. | |
| 4,340,935 | 7/1982 | Anlauf | 371/16.4 |
| 4,564,942 | 1/1986 | Horiuchi | 371/16.4 |
| 4,630,292 | 12/1986 | Juricich et al. | |
| 4,689,766 | 8/1987 | Kent | 371/16.3 |
| 4,700,303 | 10/1987 | Tokuyama | 371/16.4 |
| 4,726,024 | 2/1988 | Suziak | 371/16.3 |

FOREIGN PATENT DOCUMENTS 0072000 2/1983 European Pat. Off. .
3032484 3/1981 Fed. Rep. of Germany .

OTHER PUBLICATIONS

Patent Abstracts of Japan, vol. 7, No. 106 May 10, 1983.
Patent Abstracts of Japan, vol. 10, No. 97 Apr. 15, 1986.

Primary Examiner—Michael R. Fleming
Attorney, Agent, or Firm—Sughrue, Mion, Zinn, MacPeak & Seas

[57] ABSTRACT

There is disclosed a malfunction diagnostic apparatus for a vehicle control system wherein a period of time after the last detection of a malfunction state is set by a timer, to inhibit the display of stored information when the period of time has exceeded over a specific period of time, and to release the inhibited display in accordance with an inhibition release signal.

7 Claims, 3 Drawing Sheets

MALFUNCTION DIAGNOSTIC APPARATUS FOR VEHICLE CONTROL SYSTEM

BACKGROUND OF THE INVENTION

1. Field of the Invention

The present invention relates to a malfunction diagnostic apparatus for a vehicle control system.

2. Description of the Related Art

Many proposals have been made to provide such a malfunction detecting apparatus for electronically controlled engines that stores information as to the occurrence of any extraordinary (malfunction) condition of an input signal to be inputted from a sensor into an electronic control apparatus in a memory cell which can retain stored information even during interruption of power supply to the electronic control apparatus, and reads the information from the memory cell at the time of repair, thereby facilitating repair and maintenance of the electronically controlled engines.

However, there takes place such a problem that, despite the absence of malfunction with the sensor and wiring, error information is mistakenly stored due to power voltage drop (at the time of engine cranking) and an external noise; in this case, repair will be performed on the basis of this error information. To solve this conventional problem, methods for automatically or selectively erasing the stored error information have been disclosed in for example Japanese KOKAI (Disclosure) Patent Applications No. 56-34540, 58-27858, and 59-213548. These methods, however, are not able to judge if the information has been stored by mistake or is a trouble which is of low repeatability but should have been found; accordingly all of the stored important as well as wrong, unnecessary information will be cleared.

The present invention has been accomplished in an attempt to solve the above-mentioned problem, and has as its object the provision of a malfunction diagnostic apparatus for vehicle control system that is able to prevent the reading of wrong, extraordinary information.

It is another object of the present invention to provide a malfunction diagnostic apparatus that is able to acquire both the contents of the malfunction judgement and the various information comparatively corresponding to a period of vehicle operation after the judgement of malfunction. As a result, there can be realized a diagnostic apparatus that diagnoses malfunctions on the basis of information of both the contents of output code of malfunction detecting means and user's explanation of malfunction, thus preventing erroneous judgement of malfunction.

SUMMARY OF THE INVENTION

The malfunction diagnostic apparatus for vehicle control system of the present invention is designed to set, by a timer, a period of time after the last detection of a malfunction state, and to inhibit the display of information stored in the memory when this period of time exceeds a specific period, and to release the inhibited display of the stored information in accordance with an inhibition release signal.

That is, when a period of time set by the timer or a counter, which is corresponding to a period of time after the last detection of occurrence of a malfunction, has exceeded a specific value, the present invention inhibits the display of stored information to prevent confusion, and releases the inhibited display of the stored information when needed, thus enabling the re-setting of re-display.

BRIEF DESCRIPTION OF THE DRAWINGS

For a better understanding of the present invention, reference will be made to read the following description in conjunction with the accompanying drawings, in which.

DETAILED DESCRIPTION OF THE PREFERRED EMBODIMENTS OVERALL ARRANGEMENT OF VEHICLE CONTROL SYSTEM

Figure 1:
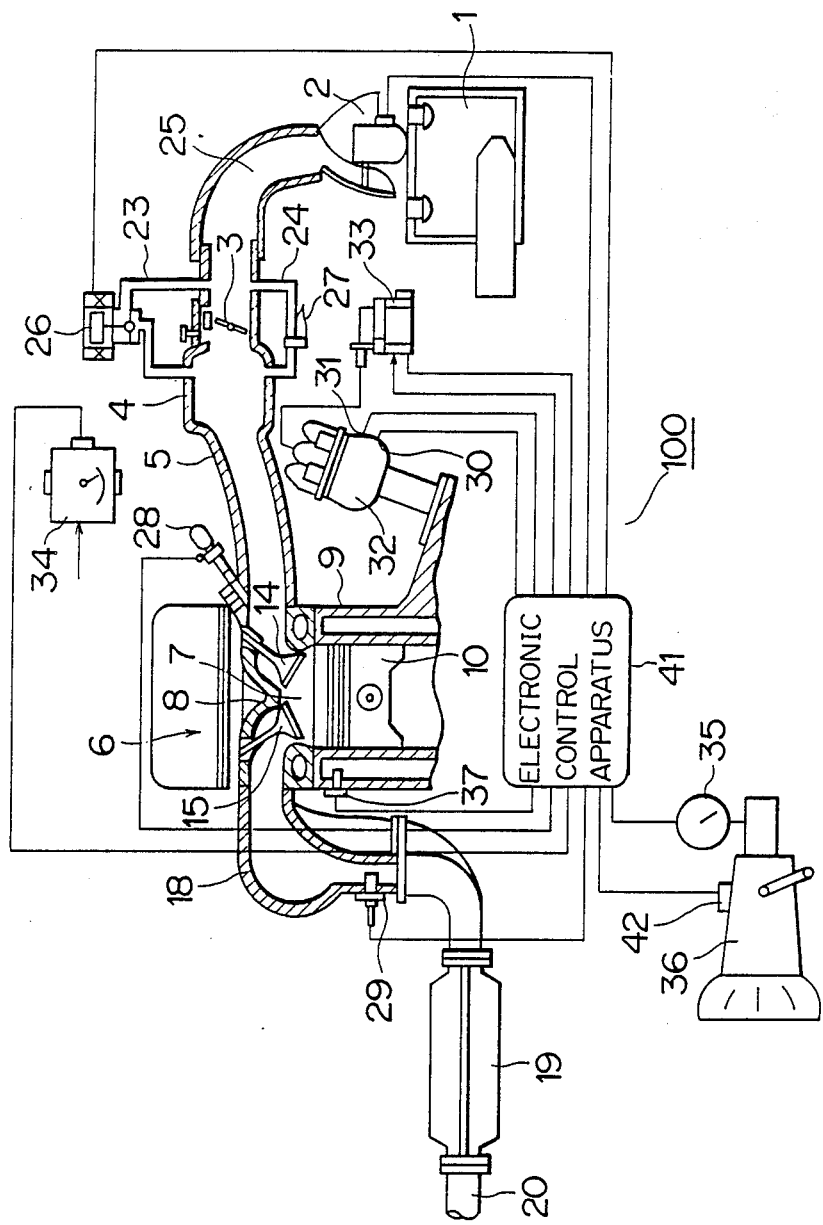
FIG. 1 is a block diagram of a vehicle control system according to one embodiment of the present invention partially broken away.

FIG. 1 is a general block diagram of a vehicle control system employing the malfunction diagnostic apparatus of the present invention.

First, the overall construction of the system will be explained. In the intake system, there are arranged, in order of mention from the upstream, an air cleaner 1, an air flowmeter 2 for detecting the flow of intake air, a throttle valve 3 interlocked with an accelerator pedal (not shown) in a cabin, a surge tank 4, and an intake pipe 5. The intake pipe 5 is connected with the engine body 6. A combustion chamber 7 in the engine body 6 is defined by a cylinder head 8, a cylinder block 9, and a piston 10. An air-fuel mixture passes through an intake valve 14, being supplied into the combustion chamber 7, where the mixture is burned. The burned mixture goes through an exhaust valve 15, being exhausted out of the combustion chamber 7. In the exhaust system, there are also disposed, in order of mention from the upstream, an exhaust manifold 18, a catalytic converter 19 which holds ternary catalyzer which accelerates the oxidation and reduction of harmful components in the exhaust gases, and an exhaust pipe 20. First and second bypass passages 23, 24 connect the intake passage 25 upstream of the throttle valve 3 and the surge tank 4. In the first and second bypass passages 23, 24, there are installed a solenoid ON/OFF valve 26 and a bimetal ON/OFF valve 27. The first bypass passage 23 is used for stabilizing engine operation during idling. The solenoid ON/OFF valve 26 opens and closes the first bypass passage 23 in relation to the idling speed. The second bypass passage 24 is provided to improve engine operation during warm-up operation. While the engine is running below a specific temperature, the bimetal ON/OFF valve 27 holds the second bypass passage 24 open. A fuel injection valve 28 is mounted in the intake pipe 5, directed toward the combustion chamber 7, and opens and closes in response to an electrical input signal, injecting the fuel. An air-fuel ratio sensor 29 is mounted in the exhaust manifold 18 to detect the concentration of oxygen in the exhaust gases. A crank angle sensor consisting of two parts 30, 31 detects a crank angle from the rotation of a distributor 32 shaft connected with a crankshaft. One part 30 produces one pulse by each 720-degree change in the crank angle, while the other part 30 produces one pulse by each 30-degree change in the crank angle. The distributor 32 supplied with a secondary current from an ignition coil 33 distributes this secondary current to an ignition plug in each combustion chamber. A throttle sensor 34 detects the amount of opening of the throttle valve 3. A vehicle speed sensor 35 detects the speed of the output shaft of an automatic variable transmission system 36, that is, a vehicle speed. A water temperature sensor 37 is mounted in the cylinder block to detect the temperature of cooling water. An electronic control apparatus 41, which receives input signals from the air flowmeter 2, an air-fuel ratio sensor 29, the parts of crank angle sensor 30, 31, the ignition coil 33 (ignition confirmation signal), the throttle sensor 34, the vehicle speed sensor 35, and the water temperature sensor 37, outputs signals to the solenoid control valve 26, the fuel injection valve 28, the ignition coil 33 (primary current), and the solenoid 42 in the hydraulic pressure control circuit of the automatic variable transmission system 36. The electronic control apparatus 41 includes a CPU (central processing unit) comprising a microcomputer, a ROM (read-only memory), and a RAM (random-access memory). The CPU functions to compute the amount of fuel injected, fuel injection timing, and ignition timing in accordance with a specific program of the ROM.

ELECTRONIC CONTROL APPARATUS

Figure 2:
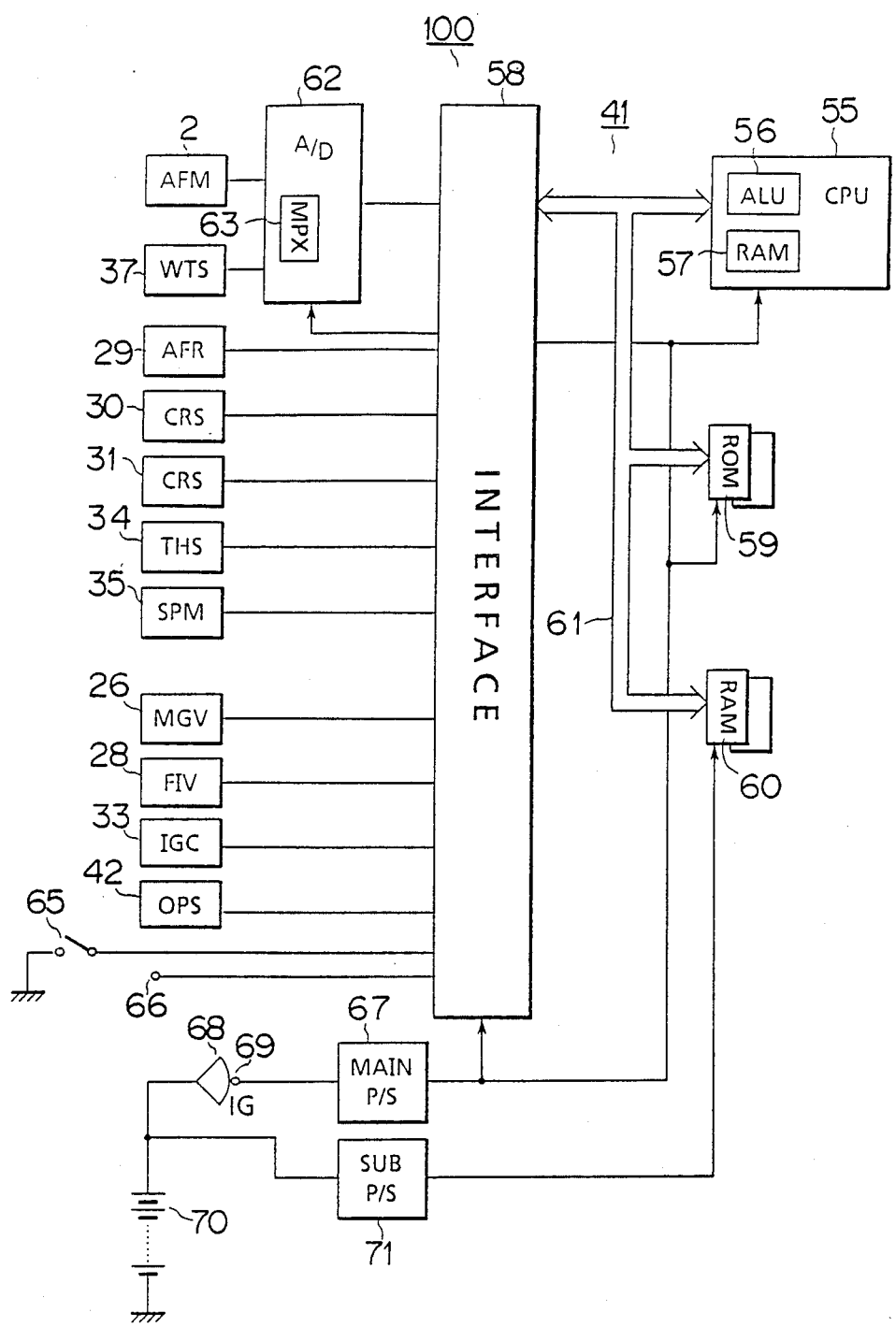
FIG. 2 is a block diagram of an electronic control apparatus.

FIG. 2 is a block diagram showing the interior of the electronic control apparatus 41 of a malfunction diagnostic apparatus 100 of the present invention. The CPU 55 includes an arithmetic logic unit (ALU) 56 and a RAM 57. The CPU 55, an input/output interface 58, a ROM 59, and a RAM 60 are connected to one another through a path 61. An A/D (Analog/Digital) converter 62 includes inside a multiplexer 63 in order to select a specific input. The CPU 55, input/output interface 58, ROM 59, and A/D converter 62 are supplied with electric power from a main power supply 67. The main power supply 67 is connected to a battery 70 via an ignition terminal 69 of an ignition switch 68 in the cabin, and is in the state that it is ready to supply the power only when the engine key is in the ON position, that is, when the ignition switch is in the closed position. The RAM 60 is supplied with the power from a sub-power supply 71. Since this sub-power supply 71 is directly connected to the battery 70, the RAM 60 is continuously energized with the power regardless of the closing and opening of the ignition switch 68, thus retaining stored information even when the engine is at a stop condition.

Analog outputs from the air flowmeter 2 and the water temperature sensor 37 are sent to the A/D converter 62, which converts them into digital values, being sent to the input/output interface 58. The output pulse from the air-fuel ratio sensor 29, the parts of crank angle sensor 30, 31, the throttle sensor 34, and the vehicle speed sensor 35 is sent into the input/output interface 58. The solenoid control valve 26, the fuel injection valve 28, and the ignition coil 33 receive input signals via the input/output interface 58. To this input/output interface is connected an output terminal 66 which is utilized for diagnosing a malfunction of the electronic control apparatus 41.

For example, an extraordinary input signal from the crank angle sensor can be judged by checking whether or not a pulse is sent to the electronic control apparatus from the crank angle sensor within a specific time after the starting of a starting motor. When the input signal from the crank angle sensor is extraordinary, no pulse will be inputted from the crank angle sensor to the electronic control apparatus within this specific time.

Also, as extraordinary input signal from the vehicle speed sensor 35 can be confirmed by checking if a pulse is sent from the vehicle speed sensor 35 to the electronic control apparatus 41 within a specific time when the engine is running at a speed exceeding over a given value with the automatic transmission 36 in the "DRIVE" range. In the event of an extraordinary input signal from the vehicle speed 35, no pulse will be inputted into the electronic control apparatus 41 from the vehicle speed sensor 35 within this specific period of time.

In addition, to detect a malfunction of the solenoid ON/OFF valves 26, 28 for example, an exciting current based on an output command is detected by the interface 58. If no exciting current flows to these valves 26, 28 despite the presence of the output command, it may be judged to be the breakage of a solenoid valve wire. In the meantime, if the exciting current flows despite the absence of this output command, it may be judged to be a trouble, such as a short circuit, of an output transistor (not shown).

Upon detection of an extraordinary signal to be inputted into the electronic control apparatus 41, the flag "1" which expresses a malfunction will be added to memory data of the RAM 60 corresponding to the extraordinary input signal (one and the other of binary logic values are defined as "1" and "0" respectively).

In vehicle repair and maintenance, signals at the output terminal 66 will be checked to detect the value of this extraordinary code. At this time, the appearance of a value of the extraordinary code at the output terminal 66 and, then a code No. "1" appears at the output terminal 66 which indicates that there exists abnormality with the input signal corresponding to the number "1" of the terminal 66.

A switch 65 is of a switch specially provided for malfunction diagnosis or an idle switch interlocked with the accelerator pedal, being primarily used for inputting the power to the electronic control apparatus 41.

EXTRAORDINARY CODE/IDLE SWITCH

The above-mentioned correlation between the extraordinary code and the function of the idle switch 65 will now be described in detail.

First, the output terminal 66 in FIG. 2 has a function to display as a specific output code, the memory content at the time of malfunction diagnosis, for example to output an output signal to a service checker at a vehicle dealer's service shop, or an output signal for communicating the content of stored information outputted to the display of the checker. In this case, the checker may be constructed of an electronic instrument, a lamp, or a light-emitting diode display.

The input switch 65 is a means for producing an inhibition release signal for releasing the inhibited display of stored information (memory content) described above, at the time of malfunction diagnosis. For example, an idle switch (not shown) which has been provided in a conventional vehicle system, is operated according to an on-off pattern preset in cipher. This encripted pattern is discriminated from patterns in general use. Thus operating the idle switch in accordance with the encripted pattern can indicate an operation to release the inhibited display of stored information.

This predetermined ON/OFF encripted pattern includes for example the following operation: Immediately after the ignition switch is turned on, the engine is turned off, and the idle switch is repeatedly turned on and off at least five times within five seconds, and then with the engine on, the idle switch is repeatedly turned on and off at least five times within five seconds.

An extraordinary condition code is, for example, of such a signal form that one pulse is produced at a fixed interval, and a signal form that two continuous pulses are produced at a fixed interval. A signal of such an extraordinary code is outputted to the output terminal 66.

MALFUNCTION DETECTING OPERATION

Figure 3:
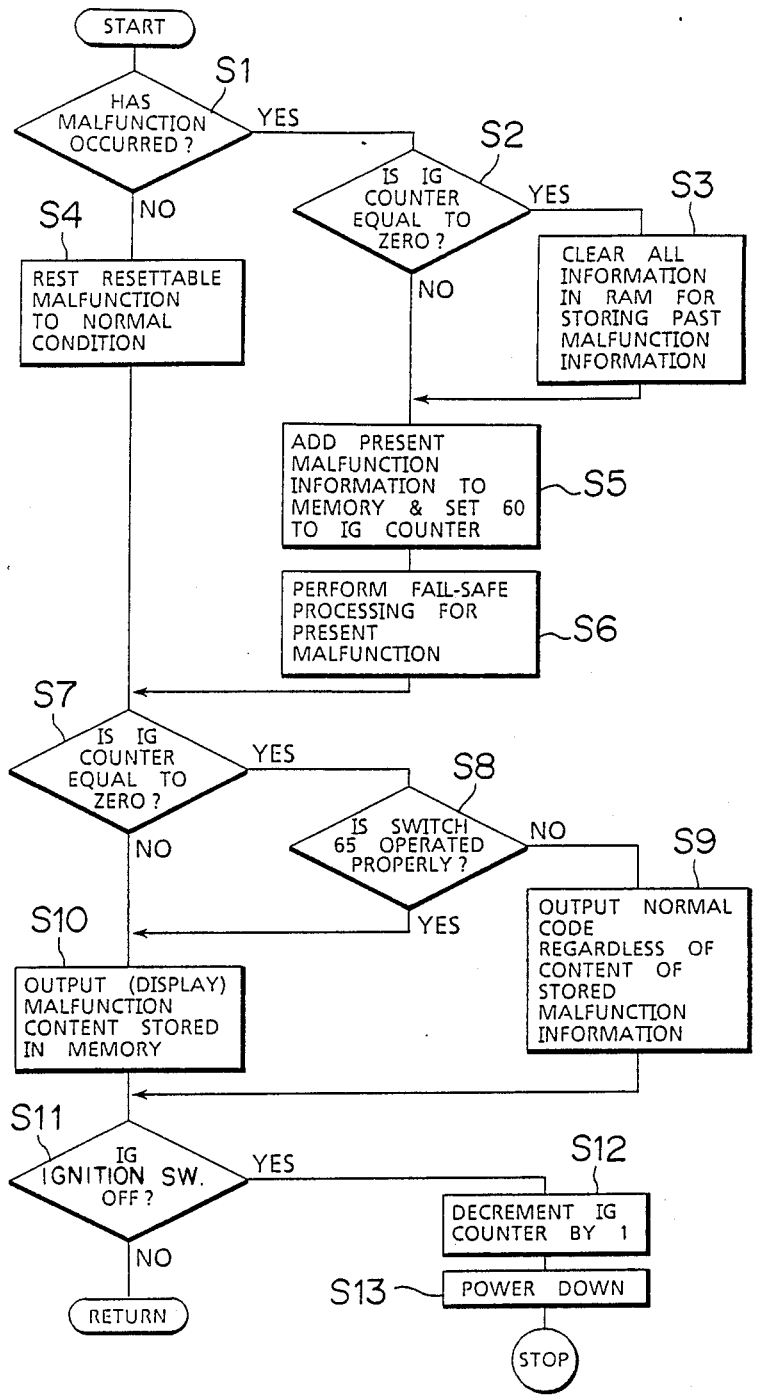
FIG. 3 is a flowchart of operation.

Next, the operation of the malfunction diagnostic apparatus 100 of the preferred embodiment shown in FIGS. 1 and 2 will now be explained in accordance with a flowchart shown in FIG. 3. At Step S1, a decision is made as to whether there has occurred a malfunction or an extraordinary condition with the input or output of the electronic control apparatus 41, and if no extraordinary condition exists, the operation proceeds to Step S4, where because no malfunction exists after the immediate performance of a malfunction processing, a failure processing should be released for those which can be reset. An alarm lamp, if on, should be turned off to reset to the normal condition. If normal, the operation will proceed to Step S7. In the meantime, if an extraordinary condition is judged at previous Step S1, the operation proceeds to Step S2, where another decision is made on a value indicated on the IG counter which counts the number of on-to-off operation of the ignition switch 68. When the value indicated on the IG counter is other than "0", the control operation advanced to Step S5. If "0" is indicated, the operation proceeds to Step S3 because a period after the previous judgement of malfunction exceeds a fixed period of time, and further proceeds to Step S5 after clearing the past malfunction information stored in the RAM 60. At this Step S5, information as to the present malfunction is stored and the IG counter in the RAM 60 is reset. The IG counter is decremented by "1" each time the switch 68 is turned off as described later.

This IG counter is mainly a memory (not shown in detail) in the RAM 60, and its address memory is counted down in interlock with the on-off operations of the ignition switch (not shown). This IG counter plays an important role in the system described above in this preferred embodiment, corresponding to the timer means which sets a period of time after the last detection of a malfunction state. As a circuit element, this counter corresponds to a microprocessor including a CPU 55 and an ALU 56.

If there occurs no malfunction for a period of about 30 days with the engine operated at a rate of twice a day, the counter is reset to zero. At Step S6, a fail-safe processing is performed of a present malfunction. The alarm lamp or other will be turned on if necessary, to give a warning to a car driver. At Step S7, a judgement is made to see whether or not the IG counter registers "0." If "0" is not registered, the operation will proceed to Step S10, outputting a content of malfunction to the output terminal 66, for example, to the LED display, thereby insuring immediately reading the content of malfunction stored in the RAM 60 and fast finding out the malfunction at a repair shop in the event of repeated occurrence of malfunctions or a short period after the detection of the latest malfunctions. However, when an extraordinary code is set by mistake during repair of a vehicle or by noise, vehicle operation performance will not be lowered and accordingly the vehicle will not be brought in for repair to a repair shop by the car driver.

Examples of a setting procedure of this extraordinary code are as follows. Prior to resetting a sensor or an actuator under repair, the ignition switch is turned on, and at this time, the alarm lamp is illuminated. When a repair engineer has noticed this illumination of the alarm lamp at once and reset the actuator to normal, but forgot erasing the stored information; and when, in the event of excessive discharge of a car battery, the vehicle is started by the power supplied from another car battery, and during travelling, the excessively discharged battery is recharged up to a normal voltage. Also, when a period of for example about 30 days has passed without recurrence of the same kind of malfunction and extraordinary condition, the IG counter reaches zero, and the control process is advanced to the operation proceeding for judgement of Step S8. If no special request is made by the driver at the time of checking the output terminal 66 at the repair shop, the switch 65 will not be operated and therefore the operation will proceed to Step S9. The output terminal 66 outputs a normal code regardless of storage of information as to malfunction. If, at this time, the car driver makes a request for a check for the reason that some abnormality was noticed in operation performance although not very frequently, but at a rate of once in several months, or several times a few months ago, and thereafter no extraordinary condition has taken place, the switch 65 will be operated by a fixed procedure, and the operation will proceed to Step S10, where details of the stored information as to the past malfunction can be confirmed. Next, at Step S11, whether or not the switch 68 is in the off position is judged. If the switch 68 remains on, the operation will go back to START. Conversely, if the switch 68 is off, the IG counter is decremented by "−1" at S12, and then at Step S13, the operation of the CPU will be powered down.

MODIFICATIONS

In the aforementioned preferred embodiment, the extraordinary input and output of the control apparatus in conjunction with engine control has been explained. The control apparatus may be also widely applicable to the prevention of occurrence of error information on the abnormality of all input and output signals in an operation control apparatus of a suspension, a transmission, and so forth. According to the control apparatus, the timer means counted the number of on-to-off operation of the IG switch. Besides the number of the on-to-off operation, similar functions may be expected to control such values representing vehicle operating time as the off-to-on number of IG switch operation, an accumulated on-duration time of the ignition system, and an accumulated value of distance traversed.

For example, there may be adopted such a method that the IG counter is set at "180," from which the count value is counted down by "−1" every one kilometer, or every five minutes accumulated.

In the preferred embodiment, the memory contents were displayed. Alternatively, such information may be announced by way of, for instance, sounds, light etc.

While the above-mentioned example has been described on the supposition that the vehicle is operated twice a day, it will be readily understood that the invention is not to be limited thereto, but may be set to other counting numbers.

According to the present invention, as described above, a period of time after the last detection of malfunction is preset by the timer, and when this preset period of time exceeds a fixed period of time, the display of the stored information is inhibited and the inhibited display of the stored information is released, thereby preventing incorrect judgement of malfunction information. As it is not needed to disconnect a battery terminal from a car battery in order to erase the stored information on malfunction, no adverse effect will occur to other memory holding devices. Furthermore, it is possible to read information on a less recurrent malfunction even after the lapse of a fixed period of time, and also as stored information concerning old malfunctions are cleared by a new malfunction, the memory capacity can be utilized effectively.

In other words, the stored information on only such malfunctions that are of low frequency, will not be erased. If a low-frequently occurring malfunction takes place before the occurrence of a high-frequently occurring malfunction and no claim is made by a car user, the stored information on the low-frequently occurring malfunction described above will be cleared at the time of occurrence of this high-frequently occurring malfunction.

What is claimed is:

1. A malfunction diagnostic apparatus for a vehicle control system, comprising:
    detecting means for detecting a malfunction state of a vehicle control system;
    memory means for storing information representing the detected malfunction state;
    memory output means for outputting information, representing the detected malfunction state, stored in said memory means;
    timer means for counting a period of time since said detecting means last detected the malfunction state;
    inhibiting means for inhibiting said memory output means from outputting malfunction state information stored in said memory means only when the period of time counted by said timer means exceeds a fixed period of time;
    means for producing an inhibition release signal; and
    means for disabling said inhibiting means in response to the produced inhibition release signal so that said memory output means can output information, representing the detected malfunction state, stored in said memory means.

2. The malfunction diagnostic apparatus for a vehicle control system as claimed in claim 1, wherein said timer means comprises a central processing unit having an arithmetic calculation unit and a random access memory.

3. The malfunction diagnostic apparatus for a system as claimed in claim 1, wherein said timer means counts an off-to-on number of an ignition switch.

4. The malfunction diagnostic apparatus for a vehicle control system as claimed in claim 1, wherein said timer means counts an accumulated time period of an on-duration time of an ignition switch.

5. The malfunction diagnostic apparatus for a vehicle control system as claimed in claim 1, wherein said timer means counts an accumulated drive distance of an automobile.

6. The malfunction diagnostic apparatus for a vehicle control system as claimed in claim 1, wherein said timer means counts a drive time of an automobile.

7. The malfunction diagnostic apparatus for a vehicle control system as claimed in claim 1, wherein if said detecting means detects a present malfunction state $M_{x+1}$ and the period of time counted by said timer means since the previously detected malfunction state $M_x$ exceeds said fixed period of time, then said memory means clears information representing the previously detected malfunction state Mx and stores information representing the present malfunction state $M_{x+1}$, and said timer means resets the counted period of time.

* * * * *